United States Patent
Han

(10) Patent No.: US 7,772,638 B2
(45) Date of Patent: Aug. 10, 2010

(54) NON-VOLATILE MEMORY DEVICE

(75) Inventor: Il Seok Han, Cheongju (KR)

(73) Assignee: MagnaChip Semiconductor Ltd., Chungcheongbuk-do (KR)

( * ) Notice: Subject to any disclaimer, the term of this patent is extended or adjusted under 35 U.S.C. 154(b) by 33 days.

(21) Appl. No.: 11/647,203

(22) Filed: Dec. 29, 2006

(65) Prior Publication Data

US 2007/0152262 A1  Jul. 5, 2007

(30) Foreign Application Priority Data

Dec. 29, 2005  (KR) .................. 10-2005-0134385

(51) Int. Cl.
*H01L 27/108* (2006.01)
(52) U.S. Cl. .............. 257/318; 257/296; 257/386; 257/E27.108
(58) Field of Classification Search ........... 257/296, 257/300, 311, 346, 386, E27.107, 318
See application file for complete search history.

(56) References Cited

U.S. PATENT DOCUMENTS

| | | | | |
|---|---|---|---|---|
| 4,807,003 A | * | 2/1989 | Mohammadi et al. ...... 365/187 |
| 4,935,790 A | * | 6/1990 | Cappelletti et al. ......... 257/318 |
| 5,282,161 A | * | 1/1994 | Villa ..................... 365/185.1 |
| 5,440,159 A | * | 8/1995 | Larsen et al. ............... 257/318 |
| 5,786,614 A | * | 7/1998 | Chuang et al. ............. 257/318 |
| 5,789,777 A | * | 8/1998 | Kojima ..................... 257/314 |
| 6,544,847 B2 | * | 4/2003 | Chen et al. ................. 438/258 |
| 2004/0256658 A1 | * | 12/2004 | Park et al. .................. 257/315 |
| 2007/0298571 A1 | * | 12/2007 | Park et al. .................. 438/275 |

* cited by examiner

*Primary Examiner*—Davienne Monbleau
*Assistant Examiner*—Eduardo A Rodela
(74) *Attorney, Agent, or Firm*—Morgan Lewis & Bockius LLP

(57) ABSTRACT

Provided is a non-volatile memory device that can repetitively perform data write and erase operations in an embedded semiconductor device. In the non-volatile memory device, a device isolation region isolates a first active region and a second active region formed on a semiconductor substrate. A transistor electrode is formed on a first insulating layer in the first active region. A first capacitor electrode is formed on a second insulating layer in the first active region. A second capacitor electrode is formed on a third insulating layer in the second active region and electrically connected to the transistor electrode and the first capacitor electrode.

5 Claims, 3 Drawing Sheets

[Fig. 1]
-Prior Art-
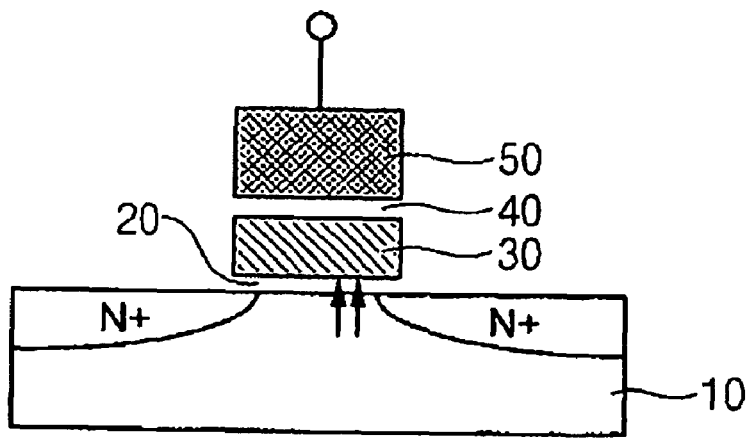
[Fig. 2]
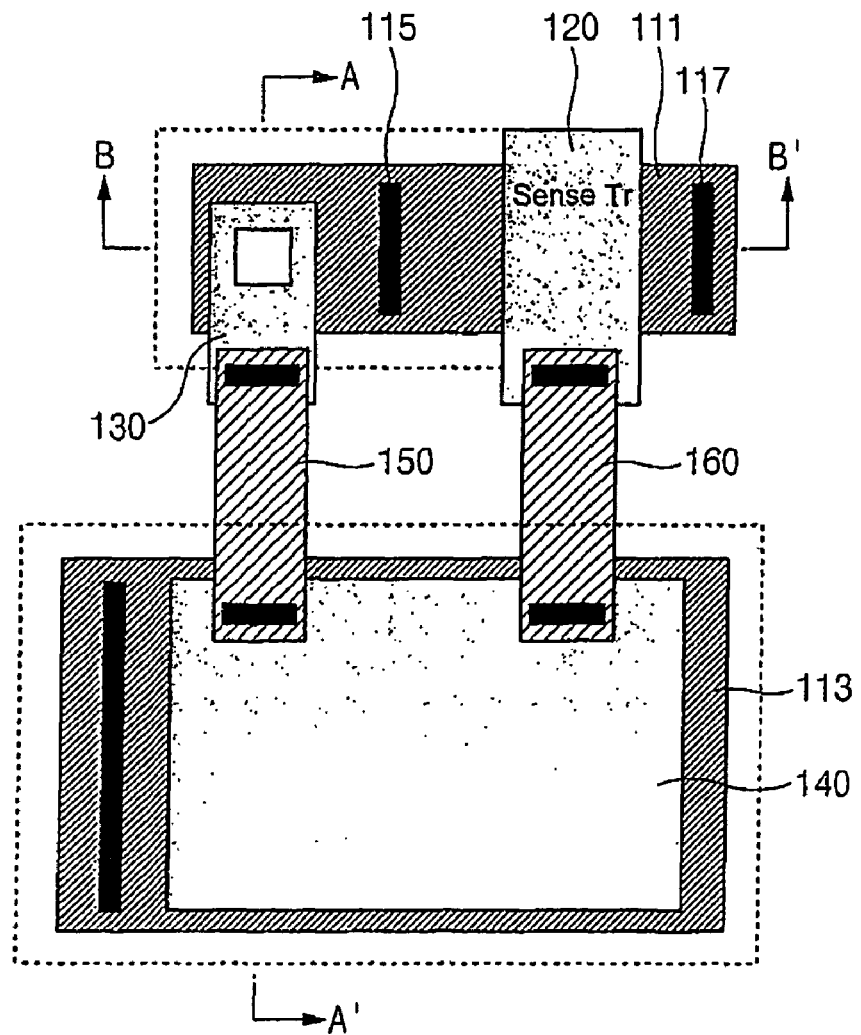

[Fig. 3]
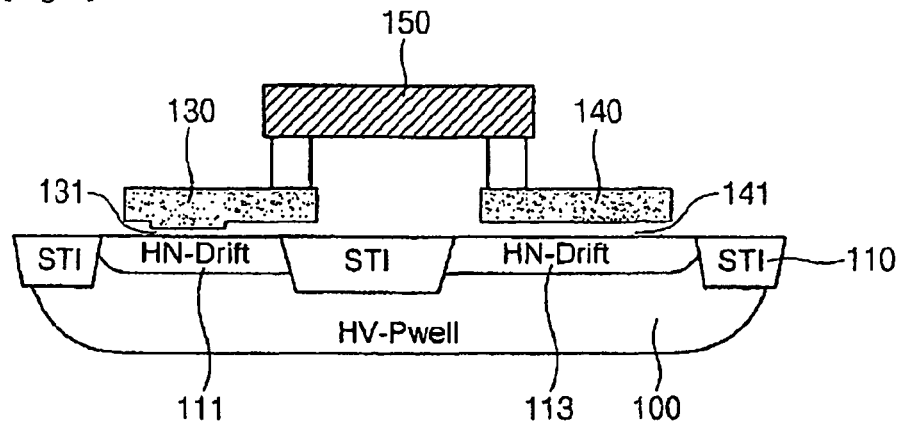
[Fig. 4]
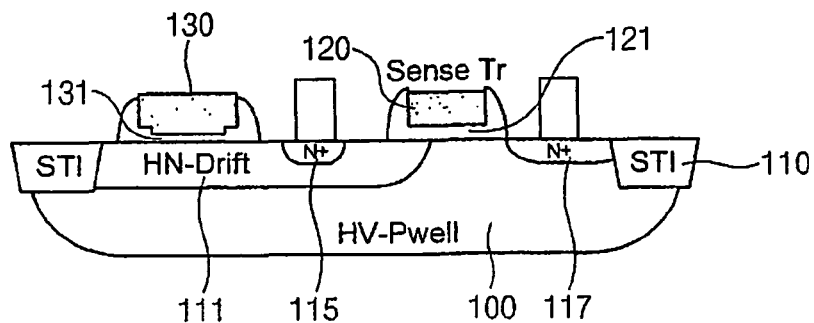
[Fig. 5]
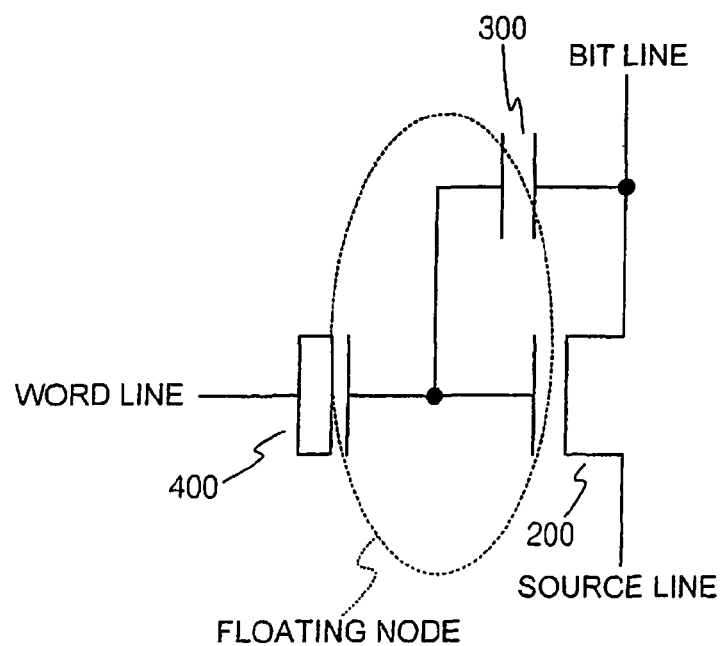

NON-VOLATILE MEMORY DEVICE

CROSS-REFERENCE TO RELATED APPLICATIONS

This application claims the benefit of Korean Patent Application No. 10-2005-0134385 filed with the Korea Intellectual Property Office on Dec. 29, 2005, the disclosure of which is incorporated herein by reference.

BACKGROUND OF THE INVENTION

1. Field of the Invention

The present invention relates to a non-volatile memory device, and more particularly, to a non-volatile memory device that can repetitively perform data write/erase operations in an embedded semiconductor device.

2. Description of the Related Art

As the use of digital devices increases, the use of non-volatile memory devices is also increasing. The non-volatile memory devices can repetitively perform data write/erase operations.

An embedded semiconductor device having the non-volatile memory function is a device in which a memory device and a logic circuit for driving the memory device are implemented in a single chip. That is, the embedded semiconductor device is fabricated using the combination of a logic semiconductor fabrication technology and a non-volatile memory fabrication technology.

FIG. 1 is a cross-sectional view of a memory cell structure of a conventional non-volatile memory device.

Referring to FIG. 1, the conventional non-volatile memory device includes a first insulating layer 20 on a semiconductor substrate 10. A floating electrode 30 is formed on the first insulating layer 20 acting as a tunneling oxide layer. A second insulating layer 40 is formed on the floating electrode 30 and a control electrode 50 is formed on the second insulating layer 40.

When the conventional non-volatile memory device having a stack gate type memory cell structure with the dual gate structure is used as a non-volatile memory device of an embedded semiconductor device, additional processes as well as a logic circuit process are required to form non-volatile memory cells. The additional processes include a process of forming the tunneling oxide layer 20, a process of forming the floating electrode 30, and a process of forming the second insulating layer 40 and the control electrode 50 on the floating electrode 30. Thus, the conventional non-volatile memory device has problems in that a manufacturing process becomes complex and a manufacturing cost increases.

As the degree of integration increases, the stack type non-volatile memory cells are widely used. In this case, because the topology excessively increases, the planarization becomes difficult in a following process and the process difficulty further increases.

SUMMARY OF THE INVENTION

An advantage of the present invention is that it provides a non-volatile memory device that can be fabricated using the conventional logic circuit fabrication process, while having no stacked electrode structure.

Additional aspect and advantages of the present general inventive concept will be set forth in part in the description which follows and, in part, will be obvious from the description, or may be learned by practice of the general inventive concept.

According to an aspect of the invention, a non-volatile memory device includes: a semiconductor substrate; a device isolation region isolating a first active region and a second active region formed on the semiconductor substrate; a transistor electrode formed on a first insulating layer in the first active region; a first capacitor electrode formed on a second insulating layer in the first active region; and a second capacitor electrode formed on a third insulating layer in the second active region and electrically connected to the transistor electrode and the first capacitor electrode.

According to another aspect of the present invention, the first insulating layer is thicker than the second insulating layer, and the second capacitor electrode is formed within the second active region.

According to a further aspect of the present invention, the first insulating layer has a thickness equal to the third insulating layer, and the first insulating layer and the third insulating layer are simultaneously formed.

According to a further aspect of the present invention, the transistor electrode and the first capacitor electrode are connected to the second capacitor electrode through a metal line.

According to a further aspect of the present invention, the non-volatile memory device further includes a select transistor electrode formed on a fourth insulating layer in the first active region.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a cell structure of a conventional non-volatile memory device;

FIG. 2 is a cell layout of a non-volatile memory device according to an embodiment of the present invention;

FIG. 3 is a cross-sectional view taken along line A-A' of FIG. 2;

FIG. 4 is a cross-sectional view taken along line B-B' of FIG. 2;

FIG. 5 is a circuit diagram of a memory cell of the non-volatile memory device of FIG. 2.

DETAILED DESCRIPTION OF THE PREFERRED EMBODIMENTS

Figure 6:
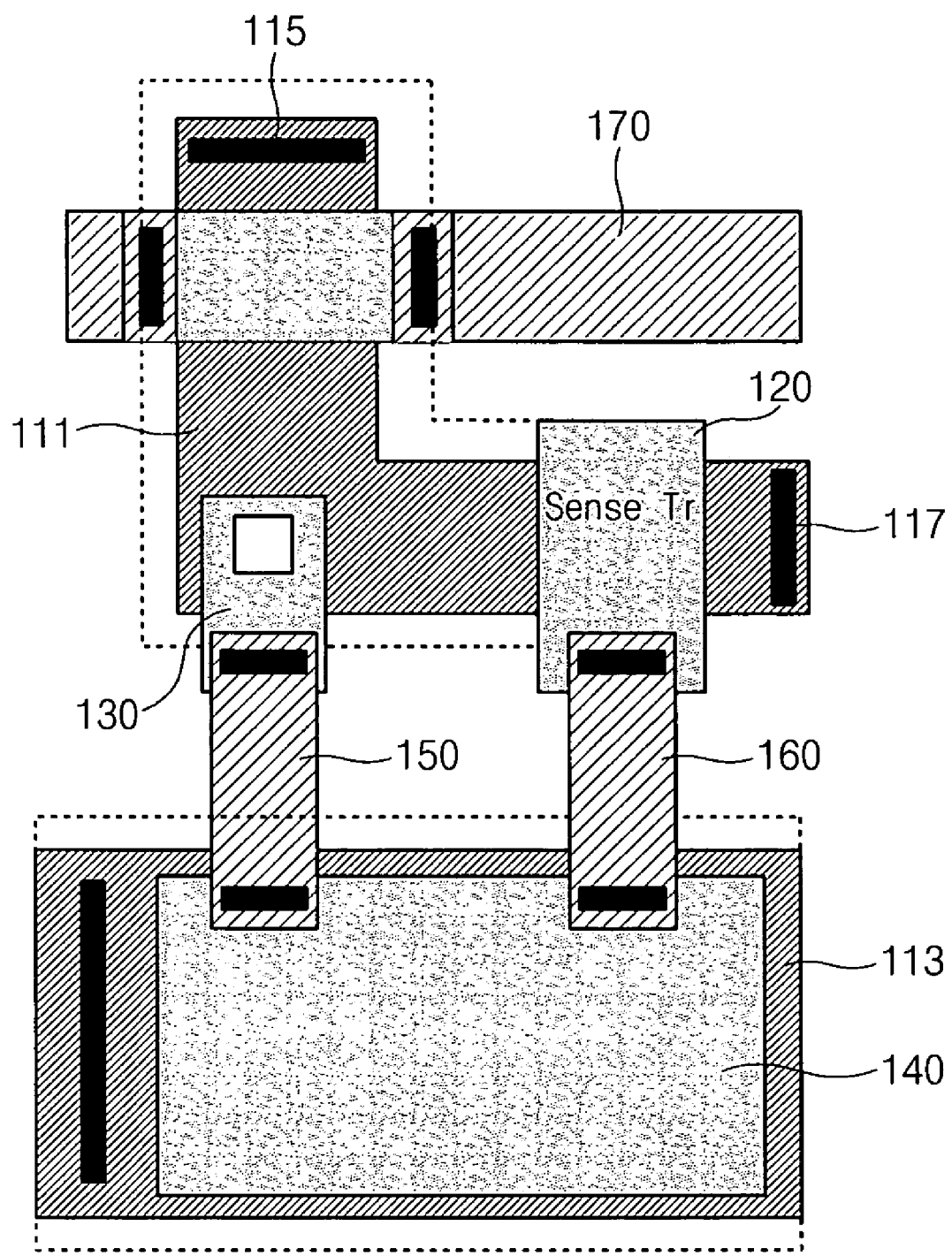
FIG. 6 is a cell layout of a non-volatile memory device according to another embodiment of the present invention.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

FIG. 2 is a cell layout of a non-volatile memory device according to an embodiment of the present invention, FIG. 3 is a cross-sectional view taken along line A-A' of FIG. 2, and FIG. 4 is a cross-sectional view taken along line B-B' of FIG. 2.

Referring to FIGS. 2 to 4, the non-volatile memory device includes a semiconductor substrate 100, a device isolation region 110, a transistor electrode 120, a first capacitor electrode 130, and a second capacitor electrode 140.

The semiconductor substrate 100 is a substrate where electric components are formed. The semiconductor substrate 100 may be a silicon substrate that is formed of semiconductor material. Electric components are formed on the semiconductor substrate 100 through a semiconductor fabrication process.

The device isolation region 110 electrically isolates active regions where the electric components are formed on the semiconductor substrate 100. A first active region 111 and a second active region 113 are electrically isolated by the device isolation region 110. As the semiconductor device is highly integrated, it is preferable that the device isolation region 110 is formed using a shallow trench isolation (STI) process.

The transistor electrode 120 is a transistor gate electrode formed on a first insulating layer 121 in the first active region 111. The transistor electrode 120 forms a transistor in the first active region 111.

The first capacitor electrode 130 is a capacitor gate electrode formed on a second insulating layer 131 in the first active region 111. The first capacitor electrode 130 forms a first capacitor in the first active region 111. The first insulating layer 121 is thicker than the second insulating layer 131. For example, the first insulating layer 121 is an oxide layer of about 200-1,000 Å, and the second insulating layer 131 is an oxide layer of about 60-150 Å.

The first capacitor electrode 130 has an extended boundary at an edge of the second insulating layer 131 in order to prevent the second insulating layer 131 from being damaged during the process of forming the first capacitor electrode 130.

A junction of the first active region 111, which is shared by the first capacitor and the semiconductor substrate 100, forms a drain 115 of the transistor. A junction of the first active region 111, which corresponds to the drain 115 with respect to the transistor electrode 120, forms a source 117 of the transistor. In this case, the transistor is an n-channel transistor, and the drain 115 and the source 117 are preferably n-type junctions.

The second capacitor electrode 140 is a capacitor gate electrode formed on a third insulating layer 141 in the second active region 113. The second capacitor electrode 140 forms a second capacitor in the second active region 113. The second capacitor electrode 140 is electrically connected to the transistor electrode 120 and the first capacitor electrode 130 through metal lines 150 and 160.

The second capacitor electrode 140 is formed within the second active region 113 and disposed not to overlap the device isolation region 110, thereby reducing parasitic capacitance. The third insulating layer 141 and the first insulating layer 121 are simultaneously formed and the second capacitor electrode 140 and the transistor electrode 120 are simultaneously formed, thereby simplifying the fabrication process. Therefore, the third insulating layer 141 is an oxide layer having the same thickness as that of the first insulating layer 121.

Preferably, the transistor electrode 120, the first capacitor electrode 130, and the second capacitor electrode 140 are formed of polysilicon.

FIG. 5 is a circuit diagram of a memory cell of the non-volatile memory device of FIG. 2.

Functions and operations of the non-volatile memory device will be described below with reference to FIGS. 2 to 5. As one exemplary application, the non-volatile memory device of FIG. 2 is preferably used as a non-volatile memory cell of the embedded semiconductor device. In this case, the non-volatile memory device can be fabricated using the processes of fabricating the embedded semiconductor device, without any additional processes.

The memory cell of the non-volatile memory device includes three electric components. A transistor 200 is a high-voltage NMOS transistor and acts as a sense transistor having a drain and a source. A first capacitor 300 including the first capacitor electrode 130 and the second insulating layer 131 is a first MOS capacitor (i.e., a tunneling gate) formed of low-voltage gate oxide, which will be used as a tunneling window for electrons.

A second capacitor 400 including the second capacitor electrode 140 and the third insulating layer 141 is used as a control gate during the write/erase operations. Specifically, the second capacitor 400 is a second MOS capacitor formed of high-voltage gate oxide for coupling a voltage applied to an n-junction. The source/drain of the control gate are connected to the n-junction using ion implant and acts as a word line of the non-volatile memory device.

The n-junction of the control gate couples a voltage applied during the write/erase operations of the memory cell by using the second MOS capacitor, and the coupled voltage is transferred through the metal lines 150 and 160 to the first capacitor electrode 130 disposed on the low-voltage gate oxide layer. At this point, the transferred voltage is applied across the tunneling oxide layer (i.e., the low-voltage gate oxide layer) according to the voltage applied to the drain. In this manner, the write/erase operations of the memory cell are carried out.

During the write/erase operations, the voltage is floating toward the source 117 so that a current path through the sense transistor 200 is interrupted. During the read operation, electric charges are charged or discharged in polysilicon, i.e., the transistor electrode, the first capacitor electrode, and the second capacitor electrode, which are connected by F-N tunneling during the write/erase operations.

The electric charges charged or discharged in the polysilicon represent a potential difference of a channel formed under the gate of the sense transistor 200. As a voltage inverting the channel of the sense transistor 200 is varied, the non-volatile memory device has the two states, i.e., a write state and an erase state.

In the case of the erase operation, when a high voltage of 10-15 V is applied to the word line metal connected to the n-junction, the lower n-junction formed under the control gate connected to the n-junction causes a MOS capacitor coupling, and an appropriate amount of the coupled voltage is applied to the metal line according to a coupling ratio and transferred to the first capacitor electrode that is the tunneling gate.

When the coupling ratio is about 70%, a voltage of 7.0-10.5 V is transferred to an upper portion of the second insulating layer 131 that is the tunneling oxide layer. At this point, a ground voltage (Vss) is transferred from the outside to the bit line connected to the drain 115. When the oxide layer is about 100 Å thick, a voltage of about 7.0-10.5 MeV is applied.

An electric field is applied to both terminals of the tunneling oxide layer in a vertical direction, and the electric charges existing in the n-junction due to the F-N tunneling tunnels into the polysilicon because of the coupled positive voltage. A threshold voltage of the memory cell, which is measured through the sense transistor 200, increases because the voltage for inverting the channel formed under the polysilicon gate further increases.

In the case of a field using a general STI process, a parasitic field transistor is formed when the electric charges pass through the field using polysilicon. A breakdown voltage and a threshold voltage of the transistor are about 12-18 V. Thus, there is no problem when the memory cell is generally used. However, a leakage current, a reduction of the coupling ratio, a reduction of the breakdown voltage, and a field inversion may occur when a high voltage of about 20 V is applied.

Therefore, in order to improve the parasitic field transistor characteristic, the polysilicon of the tunneling oxide layer and the polysilicon of the sense transistor 200 are connected to the polysilicon of the floating gate using metal. Thus, the connection between the floated polysilicons can solve the breakdown voltage reduced with respect to the polysilicon and the field inversion that may occur during the write/erase operations.

In the case of n+ junction, the junction of the memory cell is spaced apart from the polysilicon by a predetermined distance in order to prevent the breakdown of the junction due to the high voltage. In the case of the source, the junction of the memory cell has the same structure as the conventional low-voltage junction because the ground voltage is applied.

In order to mitigate the electric field, n− junction is disposed under n+ drain junction using a high-voltage n− ion implant and drive-in thermal treatment. This structure uses the processes that have been used in the conventional high-voltage device.

In the second capacitor used in the control gate, the polysilicon generally extends toward the field oxide layer. However, according to the present invention, the polysilicon is etched inside the active region in order to reduce the parasitic capacitance between the field oxide layer and the polysilicon. The first capacitor electrode disposed on the tunneling oxide layer is extended and connected to the metal line in order to reduce the damage of the second insulating layer due to plasma.

When the non-volatile memory device according to the present invention is used in the embedded semiconductor device, the first insulating layer and the third insulating layer are formed using the same process as the insulating layer of the high-voltage transistor. The second insulating layer is formed using the same process as the insulating layer of the low-voltage transistor. Therefore, the embedded semiconductor device with the non-volatile memory device can be implemented without additional processes.

In addition, the forming of the tunneling oxide layer for the tunneling of the electric charges during the write/erase operations can use a mask process of forming the high-voltage/low-voltage dual gate in the conventional embedded high-voltage process. That is, the thick high-voltage gate oxide layer of 200-1,000 Å is grown on a wafer by a thermal oxidation process. Then, a selective wet etching process is performed using a mask to selectively etch the low-voltage region (low-voltage NMOS/PMOS elements) to expose the surface of the wafer. At this point, the tunneling window region of the tunneling oxide layer is etched at the same time.

Then, the gate oxide layer is oxidized using a thermal oxidization process. Therefore, a gate oxide layer of about 60-150 Å is formed in the tunneling window region and the low-voltage element region, and a thin gate oxidization process is further performed to grow an oxide layer on the thick gate oxide layer in the high-voltage element region.

The tunneling oxide layer grown through the above-described process has the same thickness as that of the low-voltage oxide layer. During the selective etching process, the vertical and horizontal sizes of the tunneling window are about 0.4-1.2 μm, considering the coupling ratio.

As described above, the non-volatile memory device according to the present invention can be simultaneously fabricated while performing the processes required for fabricating the logic circuits in the conventional embedded semiconductor device. Therefore, additional processes are not required to fabricate the non-volatile memory device.

In addition, the topology does not increase because a single-layer electrode is used as illustrated in FIGS. 3 and 4. Therefore, the following planarization process or the metal line process becomes easy.

The write/erase/read operations of a unit cell of the non-volatile memory device according to the present invention will be described below with reference to FIG. 5.

In the erase operation, a high voltage (Vpp) of about 12-18 V is applied through the word line, and the applied high voltage (Vpp) is coupled to the second capacitor, i.e., the control capacitor 400, and is transferred to the first capacitor, i.e., the tunneling capacitor 300. At this point, because the source node of the sense transistor 200 is floating, the current path of the transistor is not formed. Because the ground voltage of 0 V is applied to the drain node, the electric field is vertically formed on both terminals of the tunneling capacitor 300. Due to the electric field, the electric charges of the drain is F-N tunneled and stored in the floating node.

That is, when the electric charges are injected into the floating node, the threshold voltage of the sense transistor 200 increases due to the injected electric charges. Therefore, there is a difficulty in the channel inversion and the cell current does not flow between the source and the drain even if a read voltage is applied.

In the write operation, the ground voltage of 0 V is applied through the word line, and the applied ground voltage (Vss) is coupled to the control capacitor 400 and is transferred to the upper portion of the tunneling capacitor 300. Because the source node of the sense transistor 200 is floating, the current path of the transistor is not formed. In addition, a high voltage of 12-18 V is applied to the drain node, and the applied high voltage is coupled to the lower portion of the tunneling capacitor 300. Therefore, the electric field is vertically formed on both terminals of the tunneling capacitor by the word line voltage and the drain voltage. Due to the electric field, the electric charges existing in the polysilicon are attracted and discharged toward the bit line by the drain voltage.

Consequently, the threshold voltage is lowered. Thus, when the read voltage is applied, the potential of the floating gate sufficiently inverts the channel and the cell current flows due to the potential difference between the source and the drain.

In the read operation, a voltage (Vdd) of about 1.8-5.0 V is applied to the bit line in a way similar to the operation of the general MOS transistor. The cell current between the source and the drain is detected by applying the equal voltage to the word line (the n− junction).

FIG. 6 is a cell layout of a non-volatile memory device according to another embodiment of the present invention. In FIGS. 2 and 6, the same reference numerals refer to the same elements.

Referring to FIG. 6, the non-volatile memory device according to another embodiment of the present invention further includes a select transistor electrode 170 on a fourth insulating layer. Specifically, the select transistor electrode 170 is formed of polysilicon on the fourth insulating layer by extending the first active region 111.

By simultaneously forming the fourth insulating layer and the first insulating layer, the select transistor electrode 170 is formed without additional processes. A junction of the first active region 111 of the select transistor electrode 170 corresponding to the source 117 forms the drain 115. The select transistor electrode 170 forms a select transistor.

The select transistor is configured to selectively apply the voltage of the drain 115 to the tunneling capacitor by the voltage applied to the select transistor electrode 170.

At this point, the select transistor is a transistor having a switching function that selects the drain voltage applied through the bit line. Thus, the non-volatile memory device having the function of selecting a specific byte is provided. Other functions and operations are identical to those of the non-volatile memory device of FIG. 2.

As described above, the non-volatile memory device according to the present invention can be fabricated at the same time when the logic circuit is fabricated, while not having the stacked electrode structure. Consequently, additional processes are unnecessary, the fabrication of the non-volatile memory device is easy, and the manufacturing cost is reduced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A non-volatile memory device comprising:
   a semiconductor substrate;
   a device isolation region isolating a first active region and a second active region formed on the semiconductor substrate;
   a well region having a first type dopant formed in both the first active region and the second active region;
   a junction region having a second type dopant formed on the well region, wherein the second type of dopant is opposite to the first type dopant;
   a sense transistor for read operation formed in the first active region comprising a first insulating layer, a polysilicon gate, a drain region and a source region,
   a first capacitor electrode for electric charge or discharge during write/erase operation formed in the first active region sharing the drain region of the sense transistor, and a tunneling insulating layer formed between the tunneling gate and the junction region;
   a second capacitor electrode for voltage coupling formed in the second active region, and a second insulating layer formed between the second capacitor electrode and the junction region;
   a first metal line which connects the sense transistor to the second capacitor electrode and a second metal line which connects the first capacitor electrode to the second capacitor electrode, the first metal line and the second metal line being physically separated,
   wherein the second capacitor electrode is disposed not to overlap the device isolation region in order to reduce parasitic capacitance,
   wherein the drain region is spaced apart from the polysilicon gate by a predetermined distance and is enclosed by the junction region to mitigate the electric field, and the drain region and the source region have the second type dopant;
   wherein the polysilicon gate of the sense transistor, the first capacitor electrode and second capacitor electrode are configured to be physically separated from one another and isolated by the device isolation region.

2. The non-volatile memory device according to claim 1, further comprising:
   a word line metal connected to the junction region to apply high voltage or ground voltage to the junction region;
   a bit line connected to the drain region to apply high voltage or ground voltage to the drain region; and
   a source line connected to the source region for floating the source region of the sense transistor.

3. The non-volatile memory device according to claim 1, wherein the first type dopant is P-type and the second type dopant is N-type.

4. The non-volatile memory device according to claim 1, further comprising:
   a select transistor electrode formed on a fourth third insulating layer in the first active region.

5. The non-volatile memory device according to claim 1, wherein the second capacitor electrode acts as a control gate for coupling a voltage applied to the junction region during a write/erase operation.

* * * * *